United States Patent
Adnan et al.

(10) Patent No.: US 12,362,779 B2
(45) Date of Patent: Jul. 15, 2025

(54) AMPLIFIER WITH PARASITIC CAPACITANCE NEUTRALIZATION

(71) Applicant: Apple Inc., Cupertino, CA (US)

(72) Inventors: Muhammad Adnan, San Jose, CA (US); Xiang Guan, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 580 days.

(21) Appl. No.: 17/683,607

(22) Filed: Mar. 1, 2022

(65) Prior Publication Data

US 2023/0283315 A1 Sep. 7, 2023

(51) Int. Cl.
*H04B 1/40* (2015.01)
*H03F 3/19* (2006.01)

(52) U.S. Cl.
CPC ............... *H04B 1/40* (2013.01); *H03F 3/19* (2013.01); *H03F 2200/451* (2013.01)

(58) Field of Classification Search
CPC ....... H04B 1/40; H03F 3/19; H03F 2200/451; H03F 2200/222; H03F 2200/294; H03F 2200/318; H03F 2200/369; H03F 2200/489; H03F 2203/45318; H03F 1/0277; H03F 2200/75; H03F 2203/45498; H03F 2203/45506; H03F 1/56; H03F 3/193; H03F 3/211; H03F 3/245; H03F 3/45183; H03F 3/72
USPC ........................................................ 455/77
See application file for complete search history.

(56) References Cited

U.S. PATENT DOCUMENTS

| 9,184,764 B1 | 11/2015 | Balasubramanian |
| 2008/0007334 A1 | 1/2008 | Manku |

(Continued)

FOREIGN PATENT DOCUMENTS

CN 107592079 A 1/2018

OTHER PUBLICATIONS

Jiang et al: "Analysis and Design of Milimeter-Wave Neutralized Power Amplifiers in 65-nm CMOS", 2019 IEEE International Conference on Integrated Circuits, Technologies and Applications (ICTA), Nov. 13, 2019; pp. 11-12 (XP033727273) [retrieved on Feb. 25, 2020].

(Continued)

*Primary Examiner* — Eugene Yun
(74) *Attorney, Agent, or Firm* — FLETCHER YODER PC

(57) ABSTRACT

Amplification circuitry is disclosed that couples neutralization transistors to amplification transistors to neutralize parasitic capacitance of the amplification transistors. Gates of a first amplification transistor and a first neutralization transistor are coupled together, and gates of a second amplification transistor and a second neutralization transistor are also coupled together. Drains of the first amplification transistor and the second neutralization transistor are coupled together, and drains of the second amplification transistor and the first neutralization transistor are also coupled together. Sources of neutralization transistors are coupled together at a node, such that a voltage swing of a first signal in the first neutralization transistor may be canceled by a voltage swing of a second signal in the second neutralization transistor. The node also couples to a resistor that prevents charge building in the neutralization transistors.

20 Claims, 8 Drawing Sheets

(56) References Cited

U.S. PATENT DOCUMENTS

| | | | |
|---|---|---|---|
| 2017/0346449 A1* | 11/2017 | Jin | .................. H03F 1/347 |
| 2018/0226932 A1* | 8/2018 | Beaudin | ............ H04W 52/0261 |
| 2019/0173439 A1 | 6/2019 | Dunworth et al. | |
| 2019/0245507 A1 | 8/2019 | Chi et al. | |
| 2021/0194445 A1 | 6/2021 | Khalaf | |
| 2021/0218376 A1 | 7/2021 | Park et al. | |

OTHER PUBLICATIONS

Mataya et al.: "If Amplifier Using CC Compensated Transistors", IEEE Journal of Solid-State Circuits, IEEE vol. SC-3, No. 4, Feb. 14, 1968, pp. 401-407 (XP002902972).

International Search Report & Written Opinion for PCT Application No. PCT/US2023/014135 dated Jun. 18, 2023; 36 pgs.

Michael Boers; A 16TX/16RX 60 GHz 802.11ad Chipset With Single Coaxial Interface and Polarization Diversity; IEEE Journal of Solid-State Circuits, vol. 49, No. 12, Dec. 2014.

Noel Deferm and Patrick Reynaert; A 100 GHz Transformer-Coupled Fully Differential Amplifier in 90 nm CMOS; K. U. Leuven, ESAT/MICAS, Kasteelpark Arenberg 10, 3001 Heverlee, Belgium; Jun. 3, 2010.

Noel Deferm; A 94GHz Differential Power Amplifier in 45nm LP CMOS; 1K.U.Leuven ESAT-MICAS, Kasteelpark Arenberg 10, 3001 Leuven, Belgium; 2NXP Semiconductors, High Tech Campus 60, 5656 AG Eindhoven, The Netherlands; Jul. 5, 2011.

Tirdad Sowlati; A 60-GHz 144-Element Phased-Array Transceiver for Backhaul Application; IEEE Journal of Solid-State Circuits, vol. 53, No. 12, Dec. 2018.

* cited by examiner

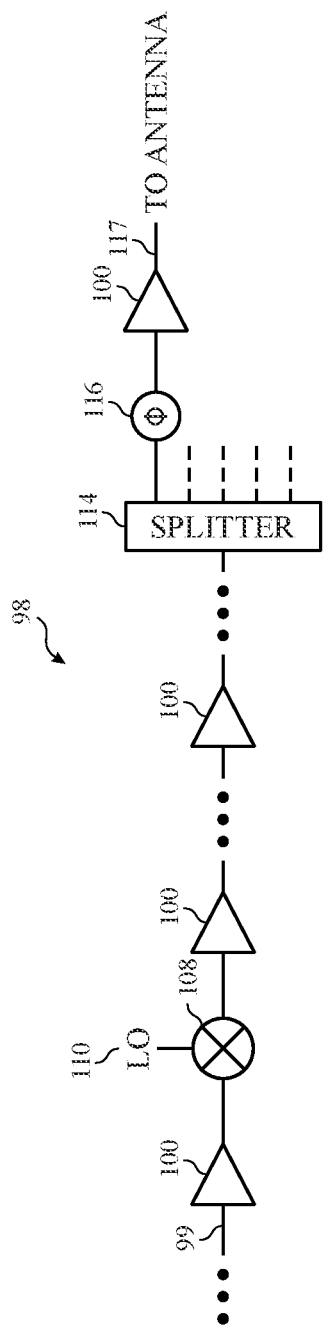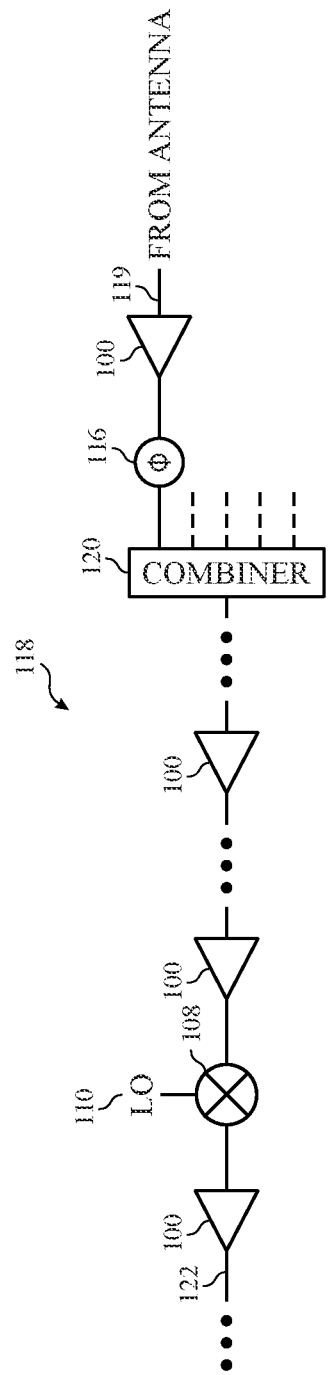
FIG. 5
FIG. 6

AMPLIFIER WITH PARASITIC CAPACITANCE NEUTRALIZATION

BACKGROUND

The present disclosure relates generally to wireless communication, and more specifically to amplifying signals for transmission or reception.

In a wireless communication device, a transmitter and a receiver may each be coupled to at least one antenna to enable the device to transmit and receive wireless (e.g., radio frequency (RF)) signals. For example, a power amplifier (PA) in a transmitter may convert a low-power RF signal to a higher power RF signal to drive the at least one antenna. As another example, a low-noise amplifier (LNA) in a receiver may convert a low-power RF signal to a higher power RF signal without adding excessive noise in order to facilitate retrieval of data in the signal.

However, and particularly for millimeter wave (mm-Wave) frequency range (e.g., 24.25-300 gigahertz (GHz)) applications, transistors used in the amplifiers may have low gain.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, an electronic device includes one or more antennas and a transceiver communicatively coupled to the one or more antennas. The transceiver includes amplifiers, each amplifier having a first transistor and a second transistor. Each amplifier also has a third transistor having a gate coupled to a gate of the first transistor, and a drain coupled to a drain of the second transistor. Each amplifier further has a fourth transistor having a gate coupled to a gate of the second transistor, a drain coupled to a drain the first transistor, and a source coupled to a source of the third transistor. The source of the third transistor and the source of the fourth transistor are coupled to a resistive component.

In another embodiment, a transceiver includes multiple amplifiers, each amplifier having a first transistor and a second transistor. Each amplifier also has a first neutralizing transistor having a gate coupled to a gate of the first transistor, and a drain coupled to a drain of the second transistor. Each amplifier further has a second neutralizing transistor having a gate coupled to a gate of the second transistor, a drain coupled to a drain the first transistor, and a source coupled to a source of the first neutralizing transistor. The source of the first neutralizing transistor and the source of the second neutralizing transistor are coupled to a resistor. The transceiver also includes multiple matching networks communicatively coupled to the multiple amplifiers.

In yet another embodiment, amplification circuitry includes a first transistor and a second transistor. The amplification circuitry also includes a first neutralizing transistor having a gate coupled to a gate of the first transistor, and a drain coupled to a drain of the second transistor. The amplification circuitry further includes a second neutralizing transistor having a gate coupled to a gate of the second transistor, a drain coupled to a drain the first transistor, and a source coupled to a source of the first neutralizing transistor. The source of the first neutralizing transistor and the source of the second neutralizing transistor are coupled to a resistor.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

FIG. 5 is a schematic diagram of a radio frequency (RF) front end of the transmitter of FIG. 3 according to embodiments of the present disclosure;

FIG. 6 is a schematic diagram of an RF front end of the receiver of FIG. 4, according to embodiments of the present disclosure;

DETAILED DESCRIPTION OF SPECIFIC EMBODIMENTS

Figure 1:
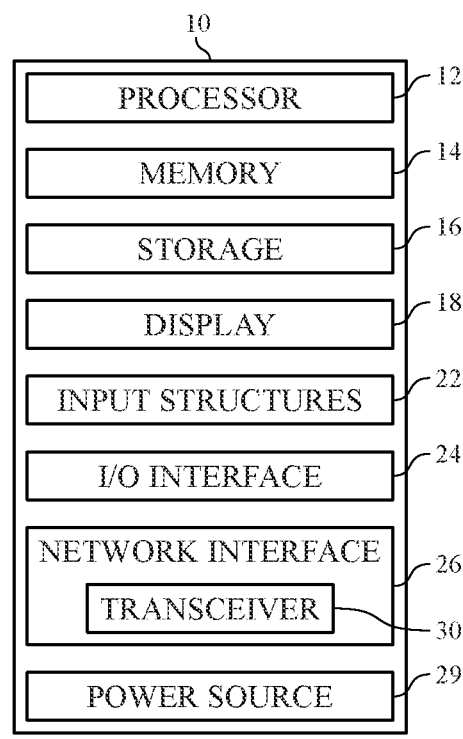
FIG. 1 is a block diagram of an electronic device, according to embodiments of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on.

This disclosure is directed to amplifying signals for transmission or reception by neutralizing parasitic capacitance in transistors. In a wireless communication device, a transmitter and a receiver may each be coupled to at least one antenna to enable the device to transmit and receive wireless (e.g., radio frequency (RF)) signals. For example, a power amplifier (PA) in a transmitter may convert a low-power RF signal to a higher power RF signal to drive the at least one antenna. As another example, a low-noise amplifier (LNA) in a receiver may convert a low-power RF signal to a higher power RF signal without adding excessive noise in order to facilitate retrieval of data in the signal.

However, and particularly for millimeter wave (mm-Wave) frequency range (e.g., 24 gigahertz (GHz) or higher, 30 GHz or higher, between 24.25 GHz and 300 GHz, and so on) applications, the transistors used in the amplifiers to amplify input signals ("amplification transistors") may have low gain, unacceptable reverse isolation, and/or instability. In particular, the amplification transistors may exhibit a parasitic capacitance, such as a gate-to-drain capacitance ($C_{gd}$), when in use. When employed in amplifiers (e.g., power amplifiers in transmitters, low-noise amplifiers in receivers), this parasitic capacitance may lead to gain loss and/or instability. In some amplifiers, a first capacitor may be used to couple a gate of a first amplification transistor to a drain of a second amplification transistor, and a second capacitor (e.g., of similar size) may be used to couple a gate of the second amplification transistor to a drain of the first amplification transistor, neutralizing parasitic capacitance of the first amplification transistor with capacitance of the first capacitor, and neutralizing parasitic capacitance of the second amplification transistor with capacitance of the second capacitor. However, process variation between manufacturing the first and second capacitors, between the first and second capacitors themselves, and/or of the gate-to-drain capacitance of the amplifiers/wireless communication device (e.g., due to real-world manufacturing imperfections) may decrease the neutralization effect of the capacitors, resulting in at least some parasitic capacitance that may cause a loss in the gain provided by the amplifiers, which may result in worse reverse isolation and instability issues.

As such, disclosed embodiments may include using transistors (e.g., "neutralization transistors") instead of capacitors to neutralize parasitic capacitance of the transistors of the amplifier. That is, gates of a first amplification transistor and a first neutralization transistor may be coupled together, and gates of a second amplification transistor and a second neutralization transistor may be coupled together. Additionally, drains of the first amplification transistor and the second neutralization transistor may be coupled together, and drains of the second amplification transistor and the first neutralization transistor may be coupled together.

In some amplifiers, a source of the first neutralization transistor may be coupled (or shorted) to a gate of the first amplification transistor, a source of the second neutralization transistor may be coupled (or shorted) to a gate of the second amplification transistor, or the sources of the neutralization transistors may be left open or uncoupled from other components. However, these amplifiers may suffer from charge buildup (e.g., in the neutralization transistors). To avoid the charge buildup, in yet other amplifiers, the sources of the amplification transistors may be coupled to a node (e.g., without any intervening components), which may also be coupled to ground. Moreover, the source of the first neutralization transistor may be coupled in series with a first resistor, the source of the second neutralization transistor may be coupled in series with a second resistor, and both resistors may also be coupled to the node that is coupled to ground. However, these amplifiers may suffer from voltage swings of signals passing through the neutralization transistors at their source, which may result in imperfect neutralization, which may impact gain, reverse isolation and even stability.

The disclosed embodiments include amplifiers that couple the sources of the neutralization transistors together at a node, such that a voltage swing of a first signal in the first neutralization transistor may be canceled by a voltage swing of a second signal in the second neutralization transistor. The node also couples to a resistor that prevents charge building in the neutralization transistors. In this manner, gate-to-drain capacitance ($C_{gd}$) of the first amplification transistor may be neutralized by $C_{gd}$ of the first neutralization transistor, and $C_{gd}$ of the second amplification transistor may be neutralized by $C_{gd}$ of the second neutralization transistor, while canceling voltage swing at a source of the first neutralization transistor with voltage swing at a source of the second neutralization transistor.

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive data between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network interface 26 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FI®), and/or a wide area network (WAN), such as any standards related to the Third Generation Partnership Project (3GPP), including, for example, a $3^{rd}$ generation (3G) cellular network, universal mobile telecommunication system (UMTS), $4^{th}$ generation (4G) cellular network, long term evolution (LTE®) cellular network, long term evolution license assisted access (LTE-LAA) cellular network, $5^{th}$ generation (5G) cellular network, and/or New Radio (NR) cellular network, a satellite network, a non-terrestrial network, and so on. In particular, the network interface 26 may include, for example, one or more interfaces for using a Release-15 cellular communication standard of the 5G specifications that include the millimeter wave (mmWave) frequency range (e.g., 24.25-300 gigahertz (GHz)) and/or any other cellular communication standard release (e.g., Release-16, Release-17, any future releases) that define and/or enable frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The power source 29 of the electronic device 10 may include any suitable source of power, such as a rechargeable lithium polymer (Li-poly) battery and/or an alternating current (AC) power converter.

Figure 2:
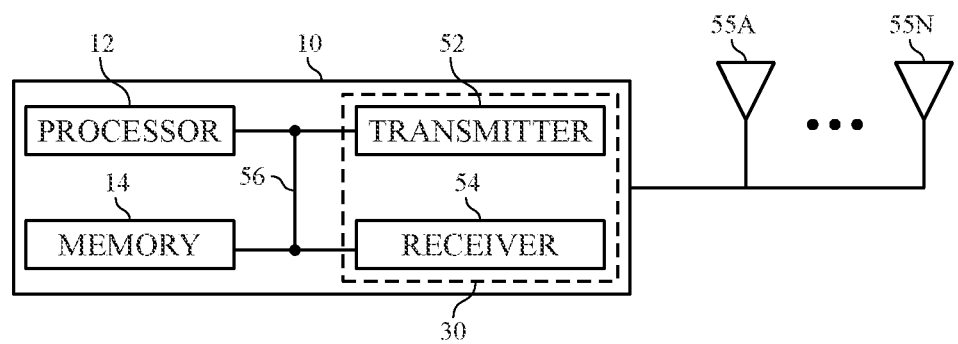
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 30, a transmitter 52, a receiver 54, and/or antennas 55 (illustrated as 55A-55N, collectively referred to as an antenna 55) may be communicatively coupled directly or indirectly (e.g., through or via another component, a communication bus, a network) to one another to transmit and/or receive data between one another.

The electronic device 10 may include the transmitter 52 and/or the receiver 54 that respectively enable transmission and reception of data between the electronic device 10 and an external device via, for example, a network (e.g., including base stations) or a direct connection. As illustrated, the transmitter 52 and the receiver 54 may be combined into the transceiver 30. The electronic device 10 may also have one or more antennas 55A-55N electrically coupled to the transceiver 30. The antennas 55A-55N may be configured in an omnidirectional or directional configuration, in a single-beam, dual-beam, or multi-beam arrangement, and so on. Each antenna 55 may be associated with a one or more beams and various configurations. In some embodiments, multiple antennas of the antennas 55A-55N of an antenna group or module may be communicatively coupled a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 54 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

Figure 3:
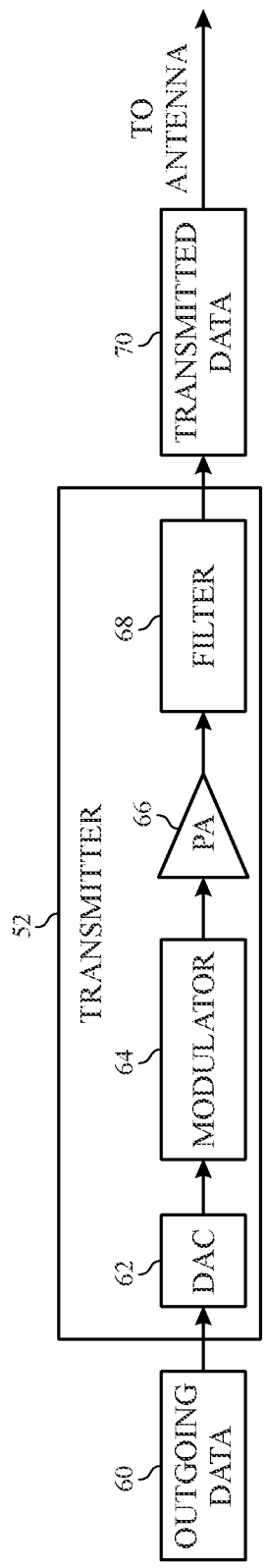
FIG. 3 is a schematic diagram of a transmitter of the electronic device of FIG. 1, according to embodiments of the present disclosure.

FIG. 3 is a schematic diagram of the transmitter 52 (e.g., transmit circuitry), according to embodiments of the present disclosure. As illustrated, the transmitter 52 may receive outgoing data 60 in the form of a digital signal to be transmitted via the one or more antennas 55. A digital-to-analog converter (DAC) 62 of the transmitter 52 may convert the digital signal to an analog signal, and a modulator 64 may combine the converted analog signal with a carrier signal to generate a radio wave. A power amplifier (PA) 66 receives the modulated signal from the modulator 64. The power amplifier 66 may amplify the modulated signal to a suitable level to drive transmission of the signal via the one or more antennas 55, and may include amplification circuitry or neutralization topology as described in further detail below. A filter 68 (e.g., filter circuitry and/or software) of the transmitter 52 may then remove undesirable noise from the amplified signal to generate transmitted data 70 to be transmitted via the one or more antennas 55. The filter 68 may include any suitable filter or filters to remove the undesirable noise from the amplified signal, such as a bandpass filter, a bandstop filter, a low pass filter, a high pass filter, and/or a decimation filter. Additionally, the transmitter 52 may include any suitable additional components not shown, or may not include certain of the illustrated components, such that the transmitter 52 may transmit the outgoing data 60 via the one or more antennas 55. For example, the transmitter 52 may include a mixer and/or a digital up converter. As another example, the transmitter 52 may not include the filter 68 if the power amplifier 66 outputs the amplified signal in or approximately in a desired frequency range (such that filtering of the amplified signal may be unnecessary).

Figure 4:
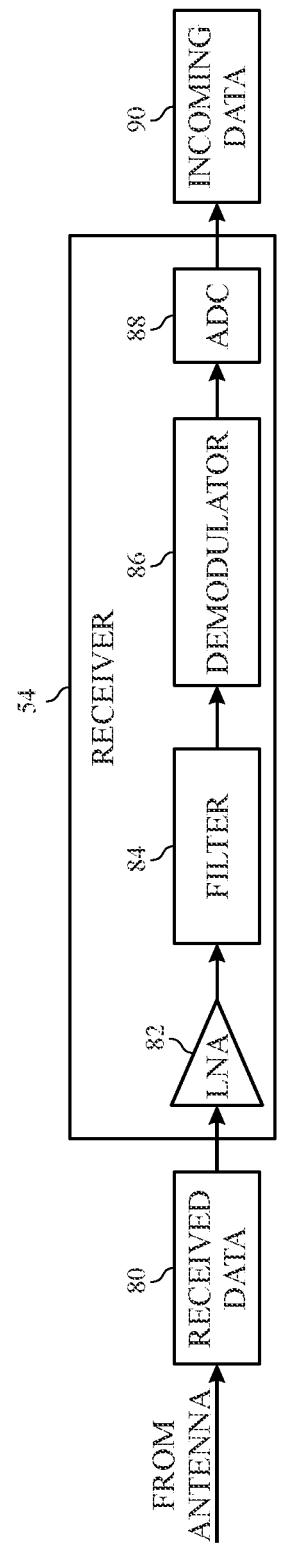
FIG. 4 is a schematic diagram of a receiver of the electronic device of FIG. 1, according to y embodiments of the present disclosure.

FIG. 4 is a schematic diagram of the receiver 54 (e.g., receive circuitry), according to embodiments of the present disclosure. As illustrated, the receiver 54 may receive received data 80 from the one or more antennas 55 in the form of an analog signal. A low noise amplifier (LNA) 82 may amplify the received analog signal to a suitable level for the receiver 54 to process, and may include amplification circuitry or neutralization topology as described in further detail below. A filter 84 (e.g., filter circuitry and/or software) may remove undesired noise from the received signal, such as cross-channel interference. The filter 84 may also remove additional signals received by the one or more antennas 55 that are at frequencies other than the desired signal. The filter 84 may include any suitable filter or filters to remove the undesired noise or signals from the received signal, such as a bandpass filter, a bandstop filter, a low pass filter, a high pass filter, and/or a decimation filter. A demodulator 86 may remove a radio frequency envelope and/or extract a demodulated signal from the filtered signal for processing. An analog-to-digital converter (ADC) 88 may receive the demodulated analog signal and convert the signal to a digital signal of incoming data 90 to be further processed by the electronic device 10. Additionally, the receiver 54 may include any suitable additional components not shown, or may not include certain of the illustrated components, such that the receiver 54 may receive the received data 80 via the one or more antennas 55. For example, the receiver 54 may include a mixer and/or a digital down converter.

FIG. 5 is a schematic diagram of a radio frequency (RF) front end 98 of the transmitter 52 of the electronic device 10, according to embodiments of the present disclosure. As illustrated, the RF front end 98 may amplify an input signal 99 by increasing power or a gain of the input signal 99 through use of amplifiers 100. The input signal 99 may be received from any suitable source, such as the processor 12 (e.g., as part of an intermediate frequency (IF) processor, a baseband processor, an application processor, and so on). The amplifiers 100 may include PAs 66 of the transmitter 52, and be coupled to a variety of suitable components or circuitry that facilitate amplification of an input signal, such as filters (which may include filters 68 of the transmitter 52), mixers 108, splitters 114, phase shifters 116, attenuators, matching networks, and so on. In particular, the RF front end 98 may include a mixer 108 may mix an input signal with another signal, such as a local oscillation signal 110, to output a signal having a desired frequency (e.g., a radio frequency). The RF front end 98 may also or alternatively include a splitter 114 that splits an input signal into multiple signals. In some embodiments, such as when implemented in phased array transmitters, the RF front end 98 may include a phase shifter 116 to shift a phase of an input signal to a desired phase. An output signal 117 of the RF front end 98 may then be sent to one or more antennas 55 for transmission. It should be understood that the RF front end 98 is merely an illustrative example of the number of amplifiers 100 and how the amplifiers 100 may be distributed in the transmitter 52 of the electronic device 10, and more or fewer components than the ones illustrated are contemplated, and, indeed, the components may be provided in different configurations.

FIG. 6 is a schematic diagram of RF front end 118 of the receiver 54 of the electronic device 10, according to embodiments of the present disclosure. As illustrated, the RF front end 118 may amplify an input signal 119 received from one or more antennas 55 by increasing power or a gain of the input signal 119 through use of amplifiers 100. The amplifiers 100 may include LNAs 82 of the receiver 54, and be coupled to a variety of suitable components or circuitry that facilitate amplification of an input signal, such as filters (which may include filters 84 of the receiver 54), mixers 108, combiners 120, phase shifters 116, attenuators, matching networks, and so on. In particular, the RF front end 118 may include a phase shifter 116 to shift a phase of an input signal to a desired phase. The RF front end 118 may also or alternatively include a combiner 120 that combines multiple input signals into a single output signal. In some embodiments, the RF front end 118 may include a mixer 108 may mix an input signal with another signal, such as a local oscillation signal 110, to output a signal having a desired frequency (e.g., a baseband or intermediate frequency). An output signal 122 of the RF front end 118 may then be sent to any suitable destination, such as the processor 12 (e.g., as part of an intermediate frequency (IF) processor, a baseband processor, an application processor, and so on). It should be understood that the RF front end 118 is merely an illustrative example of the number of amplifiers 100 and how the amplifiers 100 may be distributed in the receiver 54 of the electronic device 10, and more or fewer components than the ones illustrated are contemplated, and, indeed, the components may be provided in different configurations.

Each amplifier 100 shown in the amplifier topologies 98, 118 of FIGS. 5 and 6 may include multiple instances of amplification circuitry, and each instance of amplification circuitry may include multiple transistors (e.g., two transistors), each which may exhibit parasitic capacitance that may lead to gain loss in the amplifier 100. With multiple (e.g., two) transistors being in each instance of amplification circuitry, and multiple instances (e.g., four) of amplification circuitry in each amplifier 100, it can be seen how even a small gain loss (e.g., on the order of 1 decibel (dB)) may magnify into a significant gain loss overall.

Figure 7:
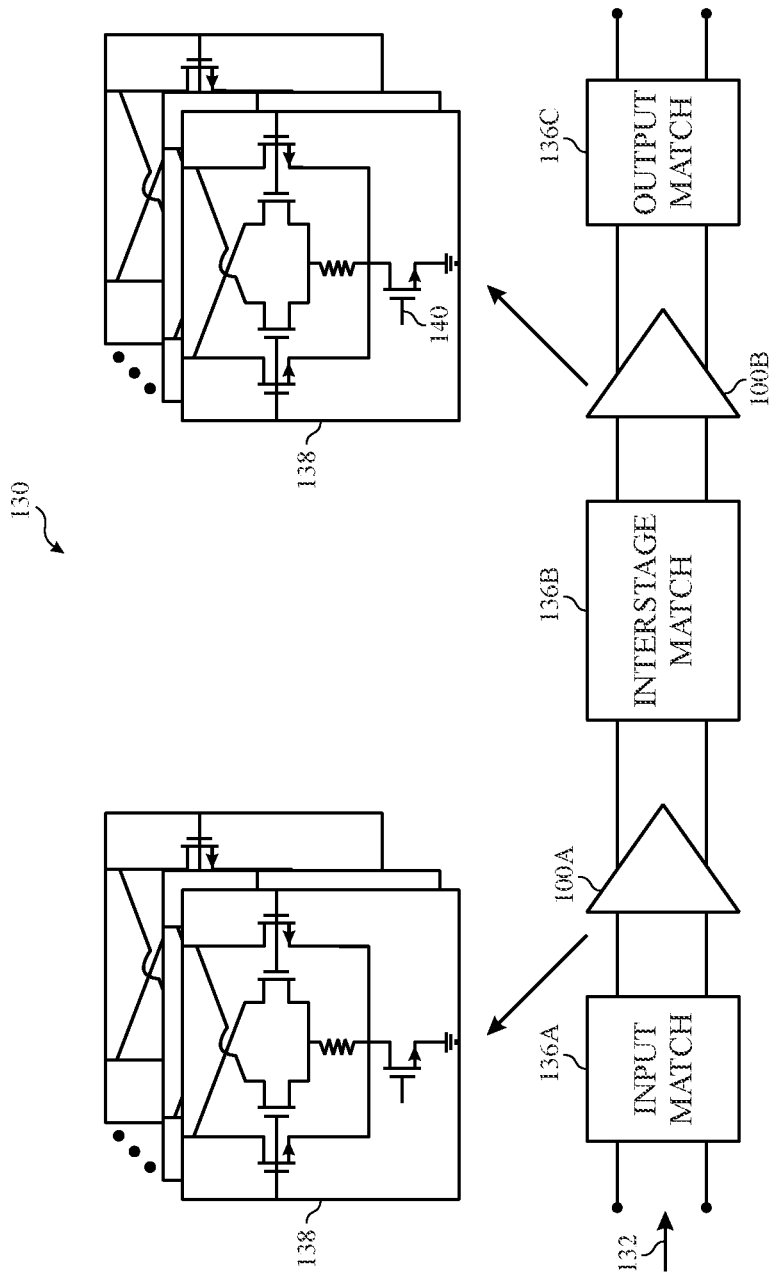
FIG. 7 is a schematic diagram of a multi-stage amplifier that may be used in the transmitter of FIG. 3 and/or the receiver of FIG. 4, according to embodiments of the present disclosure.

FIG. 7 is a schematic diagram of a multi-stage amplifier 130 that may be used in the transmitter 52 and/or receiver 54 of the electronic device 10, according to embodiments of the present disclosure. As the name suggests, the multi-stage amplifier 130 may amplify power of an input signal 132 received at an input terminal 133 in multiple stages, where each stage corresponds to an amplifier 100. As illustrated, a first amplification stage may correspond to a first amplifier 100A, and a second amplification stage may correspond to a second amplifier 100B. The multi-stage amplifier 130 may also include matching networks 136A, 136B, 136C (collectively 136) that match impedances between unequal input impedances and output impedances. In particular, the matching networks may include an input matching network 136A that matches an impedance between the input terminal 133 and an input of the first amplifier 100A, an interstage matching network 136B that matches an impedance between an output of the first amplifier 100A and an input of the second amplifier 100B, and an output matching network 136C that matches an impedance between an output of the second amplifier 100B and an output terminal 137. In some embodiments, the multi-stage amplifier 130 may also include attenuators that attenuate or reduce an amplitude of the input signal 132.

The amplifiers 100 may each include multiple instances of amplification circuitry 138. For example, each amplifier 100 may have two or more, three or more, four or more, eight or more, and so on, instances of amplification circuitry 138. Each amplification circuitry 138 may be coupled in parallel to one another within each amplifier 100, and have a respective switch 140 to activate (or couple to an operating circuit of the multi-stage amplifier 130) each amplification circuitry 138. Opening or closing each respective switch 140 to activate or deactivate each amplification circuitry 138 may vary the gain for an amplifier 100. Enabling each amplification circuitry 138 to couple to or uncouple from an operating circuit of the multi-stage amplifier 130 provides tunability, with each independent amplification circuitry 138 being neutralized internally and separately from other amplification circuitries 138.

While specific numbers of amplifiers 100, matching networks 136, and instances of amplification circuitry 138 are shown, it should be understood that more or less of these components, as well as additional other components, is contemplated. No matter the exact number of components, as with the amplifier topologies 98, 118 of FIGS. 5 and 6, because each amplifier 100 may have multiple amplification circuitries 138, and each multi-stage amplifier 130 may have multiple amplifiers 100, the effect of providing better gain and reverse isolation by neutralizing parasitic capacitance of the amplification circuitries 138 is magnified and impactful to any electronic device 10 using the multi-stage amplifier 130. For example, the gain for each amplification circuitry 138 may improve by 1.1 dB compared to not using the disclosed amplification circuitry 138, which may result in up to almost 9 dB improvement for the multi-stage amplifier 130.

Figure 8:
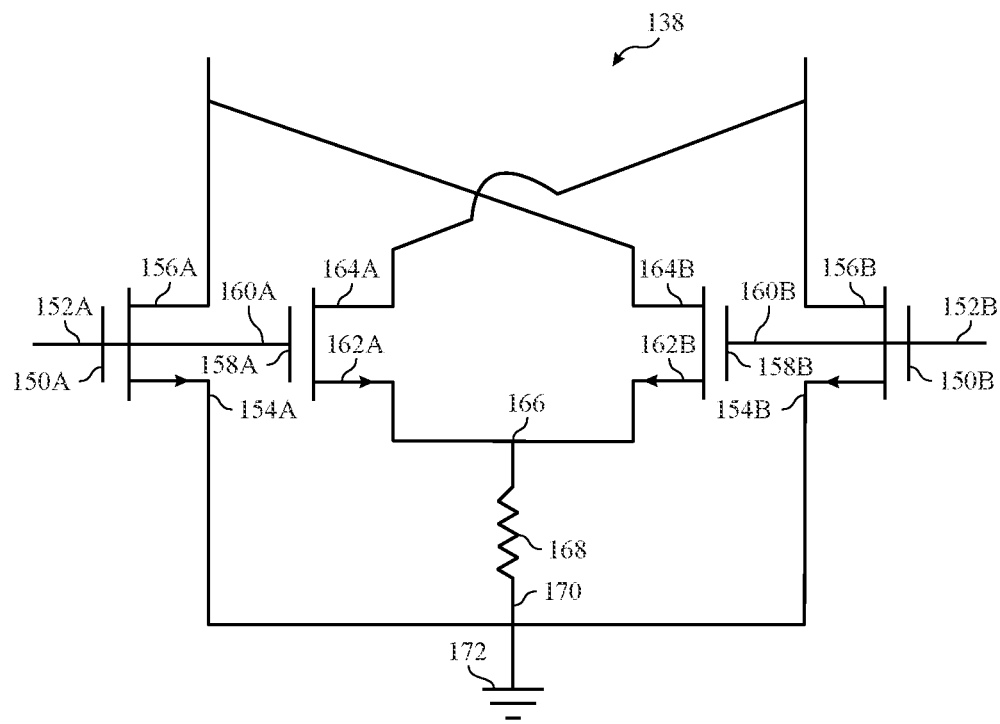
FIG. 8 is a circuit diagram of amplification circuitry that may be used in amplifiers of the electronic device of FIG. 1, including in the transmitter of FIG. 3 and/or the receiver of FIG. 4, according to embodiments of the present disclosure.

FIG. 8 is a circuit diagram of the amplification circuitry 138 that may be used in amplifiers 100 of the electronic device 10, including in the transmitter 52 and/or the receiver 54 of the electronic device 10, according to embodiments of the present disclosure. As illustrated, the amplification circuitry 138 includes transistors 150A, 150B (collectively 150) that amplify an input signal to the amplification circuitry 138. For reference, the transistors 150 may be referred to as amplification, device, or main transistors 150, and may be implemented by any suitable semiconductor device that amplifies electrical signals and power, such as metal-oxide-semiconductor field-effect transistors (MOSFETs or MOS transistors), bipolar transistors, and so on. Each amplification transistor 150A, 150B may include a gate 152A, 152B, a source 154A, 154B, and a drain 156A, 156B. The amplification circuitry 138 also includes neutralization transistors 158A, 158B (collectively 158) that respectively neutralize parasitic capacitance (e.g., a gate-to-drain capacitance ($C_{gd}$)) of the amplification transistors 150A, 150B. Like the amplification transistors 150, the neutralization transistors 158 may be implemented by any suitable semiconductor device that amplifies electrical signals and power, such as metal-oxide-semiconductor field-effect transistors (MOSFETs or MOS transistors), bipolar transistors, and so on. The amplification transistors 150 and the neutralization transistors 158 may be of similar type. Each neutralization transistor 158A, 158B may also include a gate 160A, 160B (collectively 160), a source 162A, 162B (collectively 162), and a drain 164A, 164B (collectively 164).

As illustrated, the gate 152A of the amplification transistor 150A is coupled to the gate 160A of the neutralization transistor 158A, and the gate 152B of the amplification transistor 150B is coupled to the gate 160B of the neutralization transistor 158B. Additionally, the drain 156A of the amplification transistor 150A is coupled to the drain 164B of the neutralization transistor 158B, and the drain 156B of the amplification transistor 150B is coupled to the drain 164A of the neutralization transistor 158A. The sources 162A, 162B of the neutralization transistors 158A, 158B are coupled together (e.g., directly coupled, without any intervening components, such as resistors, between the sources 162A, 162B) at node 166. The node 166 is also coupled to a resistor 168, which is coupled to a node 170. The sources 154A, 154B of the amplification transistors 150A, 150B are also coupled to the node 170, as is a ground 172. As explained in more detail below, the amplification circuitry 138 effectively neutralizes parasitic capacitance ($C_{gd}$) of the amplification transistors 150, enabling improved gain in the amplification circuitry 138.

Figure 9:
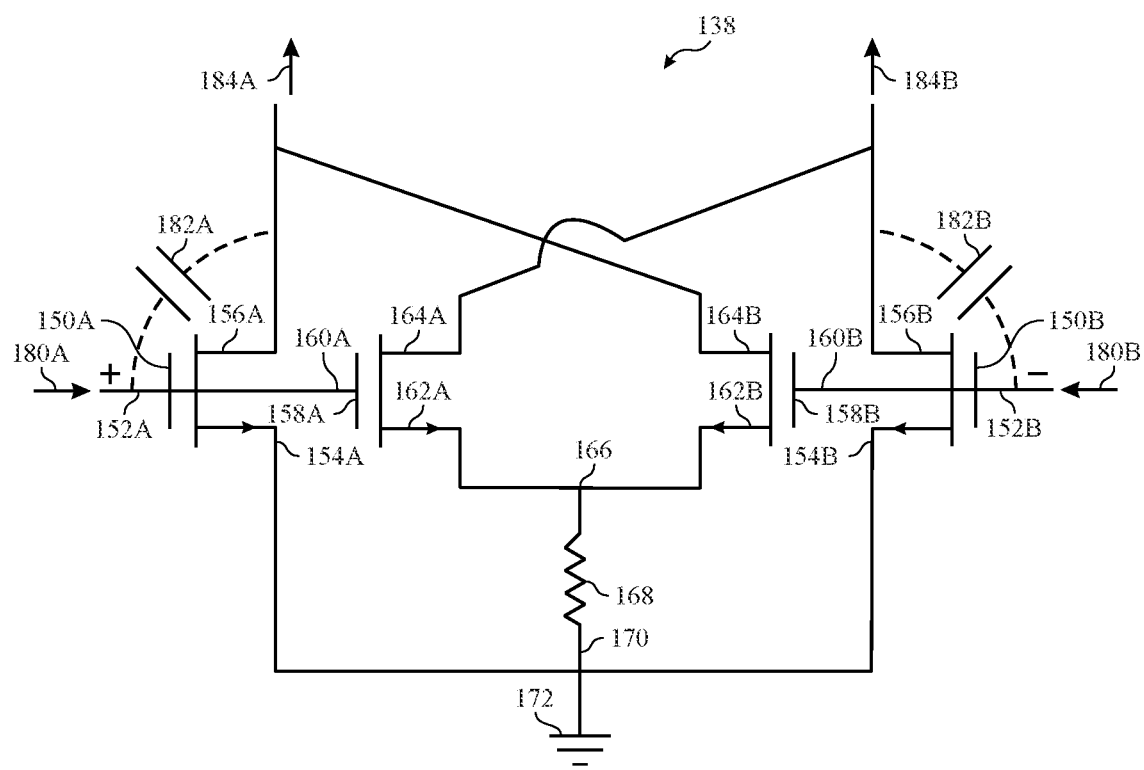
FIG. 9 is a schematic diagram of the amplification circuitry of FIG. 8 that illustrates certain operating characteristics, according to embodiments of the present disclosure.

FIG. 9 is a schematic diagram of the amplification circuitry 138 of FIG. 8 that illustrates certain operating characteristics, according to embodiments of the present disclosure. When the amplification circuitry 138 is in operation, the first amplification transistor 150A of the amplification circuitry 138 may operate in a first phase (e.g., a positive phase), and the second amplification transistor 150A may operate at a second phase (e.g., a negative phase), or vice versa, such that the amplification circuitry 138 operates as a differential structure. That is, a first input signal 180A to the first amplification transistor 150A may be out-of-phase with a second input signal 180B to the second amplification transistor 150B by 180°. The input signals 180A, 180B may include complementary portions of a differential mode input signal, and the amplification circuitry 138 may amplify (e.g., increase power and/or gains of) the input signals 180A, 180B.

The first input signal 180A may cause the first amplification transistor 150A to exhibit a first parasitic capacitance 182A (e.g., a capacitance from the gate 152A of the first amplification transistor 150A to the drain 156A of the first amplification transistor 150A), and the second amplification transistor 150B may exhibit a second parasitic capacitance 182B (e.g., a capacitance from the gate 152B of the second amplification transistor 150B to the drain 156B of the second amplification transistor 150B). It should be understood that the parasitic capacitances 182A, 182B (collectively 182) are not explicit capacitors of the amplification circuitry 138, but, instead, capacitances that exists between terminals of circuitry (e.g., of the amplification transistors 150) and electronic components of the amplification circuitry 138 because of their proximity to each other. The parasitic capacitances 182 may be denoted as $C_{gd}$ (e.g., a capacitance between a gate and drain of a transistor), and may have a detrimental impact to the amplification transistors 150 in terms of gain and isolation of output from input. That is, the parasitic capacitances 182 may cause the amplification transistors 150 to apply less gain the input signals 180A, 180B (collectively 180), compared to if there were no parasitic capacitance. Moreover, while it may be intended for the amplification transistors 150 to receive input signals 180 at their respective gates 152A, 152B (collectively 152) and output signals 184A, 184B (collectively 184) at their respective drains 156A, 156B (collectively 156), the parasitic capacitances 182 may instead create pathways for the output signals to return from the drains 156 to the gates 152. This feedback or "reverse isolation" may make the amplification circuitry 138 unstable and worsen performance of the amplification circuitry 138.

In some amplifiers, capacitors, which may be implemented using metal layers, are coupled to amplification transistors to neutralize their parasitic capacitances. For example, a first capacitor may be used to couple a gate of a first amplification transistor to a drain of a second amplification transistor, and a second capacitor may be used to couple a gate of the second amplification transistor to a drain of the first amplification transistor, neutralizing gate-to-drain parasitic capacitance ($C_{gd}$) of the first amplification transistor with capacitance of the first capacitor, and neutralizing parasitic capacitance of the second amplification transistor with capacitance of the second capacitor. However, operating characteristics of the capacitors may vary excessively (e.g., ±20% capacitance variation) due to real-world manufacturing imperfections. Similarly, the parasitic capacitance of the amplification transistors 150 may also vary because of manufacturing imperfections. The variation of capacitances of the metal capacitors and variation of the parasitic capacitance of the amplification transistors 150 may not track each other, meaning that there may be a possibility that a capacitance of a metal capacitor increases while the $C_{gd}$ of amplification transistor 150 decreases due to fabrication imperfections. This process variation between manufacturing the first and second capacitors and parasitic capacitance (e.g., $C_{gd}$) of the amplification transistors 150 may result in ineffective neutralization of the parasitic capacitances in the amplifiers, resulting in gain loss provided by the amplifiers and/or rendering the amplifiers unstable.

As such, the capacitors may be replaced with transistors (e.g., the neutralization transistors 158), which, because they may be fabricated near the amplification transistors 150 by following similar or the same fabrication steps with similar or the same processes, may not only better correlate to or match each other in capacitance, but may also track their variations. That is, if $C_{gd}$ of the amplification transistors 150 increases, the $C_{gd}$ of the neutralization transistors 158 may also increase, and vice versa, reducing or minimizing variation between the amplification transistors 150 and neutralization transistors 158. Thus, the amplification circuitry 138 enables virtually implementing a capacitor via the neutralizing transistor 158 (e.g., the neutralizing transistor 158 acts as a capacitor) that follows the amplification transistor 150 in terms of process variation, and hence may ensure robust neutralization as $C_{gd}$ of the amplification transistor 150 is being neutralized by the $C_{gd}$ of the neutralization transistor 158.

In some amplifiers, a source of the first neutralization transistor may be coupled (or shorted) to a gate of the first amplification transistor, a source of the second neutralization transistor may be coupled (or shorted) to a gate of the second amplification transistor, or the sources of the neutralization transistors may be left open or uncoupled from other components. However, these amplifiers may suffer from charge buildup (e.g., in the neutralization transistors). To avoid the charge buildup, in yet other amplifiers, the sources of the amplification transistors may be coupled to a node (e.g., without any intervening components), which may also be coupled to ground. Moreover, the source of the first neutralization transistor may be coupled in series with a first resistor, the source of the second neutralization transistor may be coupled in series with a second resistor, and both resistors may also be coupled to the node that is coupled to ground. However, these amplifiers may suffer from voltage swings of signals passing through the neutralization transistors at their sources, which may result in imperfect neutralization, which may impact gain, reverse isolation and even stability.

As illustrated in FIG. 9, the disclosed amplification circuitry 138 couples the sources 162 of the neutralization transistors 158 together at the node 166, such that a voltage swing of the first input signal 180A in the first neutralization transistor 158A, exiting its source 162A, may be canceled by a voltage swing of a second input signal 180B in the second neutralization transistor 158B, exiting its source 162B. That is, because the first and second input signals 180 may be opposite in polarity in differential mode (e.g., the second input signal 180B may be 180° out-of-phase with the first input signal 180A), they may be canceled at the node 166. Such may not be the case for amplifiers that have intervening components (e.g., resistors) between each source of a respective neutralization transistor and a node coupling the resistors. The node 166 also couples to a resistive or impedance component, such as resistor 168, which prevents charge building in the neutralization transistors 158.

It should be understood that, although a resistor is shown, the resistor 168 may be replaced by any suitable component (e.g., resistive or impedance component) that provides a resistance or impedance, such that it may be considered an open circuit from the viewpoint of the neutralization transistors 158, and block all or at least some current flow from the sources 162 of the neutralization transistors 158 to the ground 172. For example, the resistor 168 may provide a resistance of 1 ohm (Ω) or greater, 10Ω or greater, 100Ω or greater, 1 kiloohm (kΩ) or greater, 10 kΩ or greater, 100 kΩ or greater, 1 megaohm (MΩ) or greater, and so on. This is to prevent a voltage swing at the drain 164A of the first neutralization transistor 158A from cancelling signals at the coupled drain 156B of the (opposite) second amplification transistor 150B, since the voltage swing and the signals are 180° out-of-phase with one another. Similarly, the resistor 168 may also prevent a voltage swing at the drain 164B of the second neutralization transistor 158B from cancelling signals at the coupled drain 156A of the (opposite) first amplification transistor 150A. Without the resistor 168 preventing the voltage swings at the drains 164 of the neutralization transistors 158 from cancelling the signals at the coupled drains 156 of the opposite amplification transistors 150, the voltage swings may at least partially cancel gain provided by the amplification circuitry 138.

It should be noted that, while an open circuit may also block current flow from the sources 162 of the neutralization transistors 158 to the ground 172 (e.g., in place of the resistor 168), it may create charge formulation or buildup in the neutralization transistors 158, which may hamper effectiveness of the amplification circuitry 138. Additionally, as mentioned above with respect to the multi-stage amplifier 130 of FIG. 7, the switches 140 enable adjusting amplification applied by the multi-stage amplifier 130 by coupling to and engaging amplification circuitries 138 or uncoupling from and disengaging the amplification circuitries 138. In some embodiments, the resistor 168 may include a variable resistor, which may enable a controller (e.g., including the processor 12) to adjust resistance of the resistor 168, thus further enabling adjustment of (e.g., enabling finer or more granular adjustment of) amplification applied by the amplification circuitry 138.

Moreover, as described in further detail below with respect to FIGS. 10-13, because the drains 164 of the neutralization transistors 158 are coupled to the drains 156 of respective opposite amplification transistors 150 (e.g., the drain 164A of the first neutralization transistor 158A is coupled drain 156B of the second amplification transistor 150B, and the drain 164B of the second neutralization transistor 158B is coupled to the drain 156A of the first amplification transistor 150A), and the signals at the drains 164 of the neutralization transistors 158 are opposite in polarity (e.g., out-of-phase by 180°) compared to the signals at the drains 156 of the respective opposite amplification transistors 150, the signals at the drains 164 of the neutralization transistors 158 neutralize or cancel the parasitic capacitances at the opposite amplification transistors 150.

Figure 10:
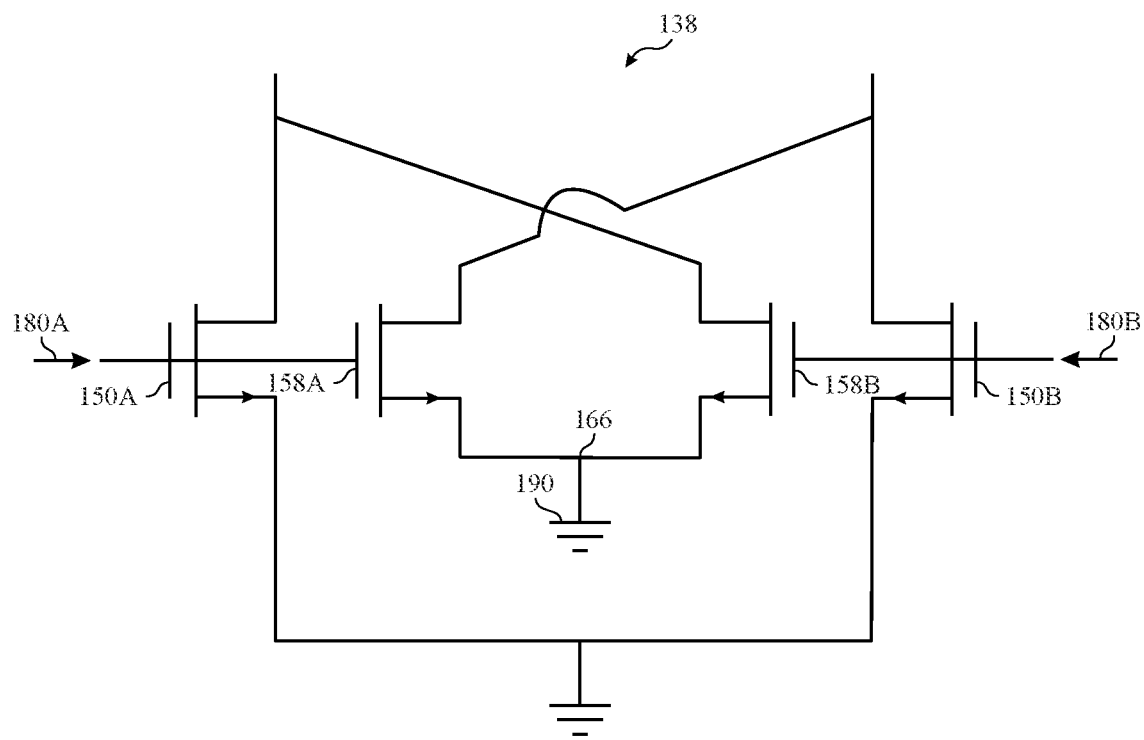
FIG. 10 is a schematic diagram of a representation of the amplification circuitry of FIG. 8 when operating using alternative current (AC), mmWave frequencies, and in differential mode, according to embodiments of the present disclosure.

FIG. 10 is a schematic diagram of a representation of the amplification circuitry 138 of FIG. 8 when operating using alternative current (AC), mmWave frequencies, and in differential mode, according to embodiments of the present disclosure. That is, the input signals 180A, 180B may include AC signals, having frequencies in the mmWave range (e.g., 24.25-300 GHz), and/or include complementary portions of a differential signal. In such cases, from the viewpoint of the amplification transistors 150 and/or the neutralization transistors 158, the node 166 may act as an AC ground 190 for the input differential signals 180. As a result, any current loading at the node 166 may be ignored when the amplification circuitry 138 is in operation.

Figure 11:
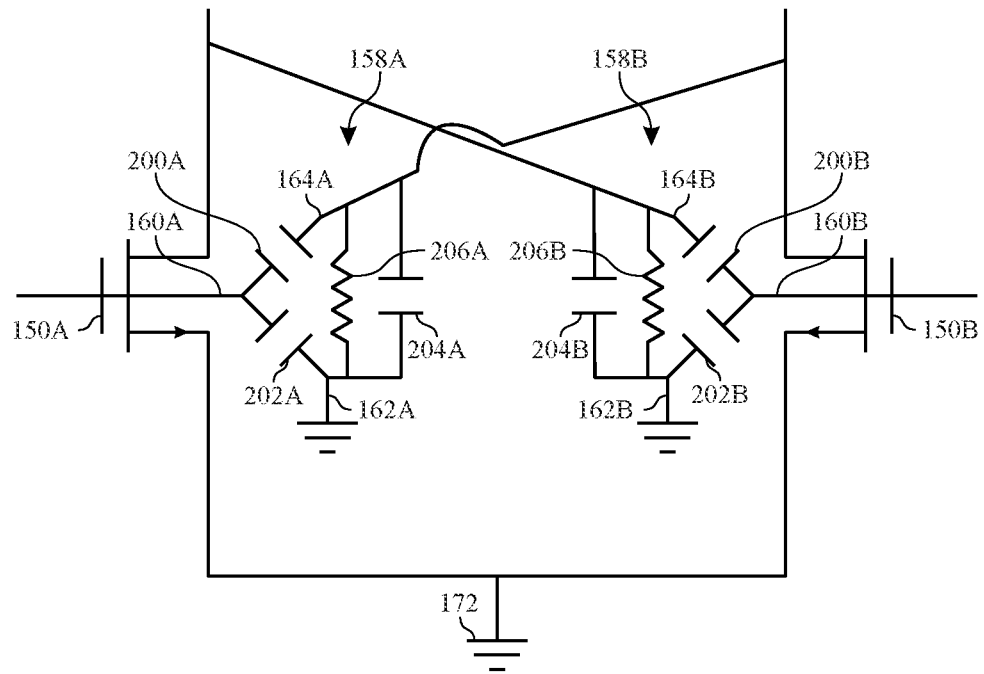
FIG. 11 is a schematic diagram of a representation of the amplification circuitry of FIG. 10 showing parasitic capacitances of neutralization transistors when operating in differential mode, according to embodiments of the present disclosure.

FIG. 11 is a schematic diagram of a representation of the amplification circuitry 138 of FIG. 10 showing parasitic capacitances of the neutralization transistors 158 when operating in differential mode, according to embodiments of the present disclosure. As illustrated, the first neutralization transistor 158A may exhibit and be represented by three parasitic capacitances, a first parasitic capacitance 200A from the gate 160A of the first neutralization transistor 158A to the drain 164A (which may be referred to as $C_{gd}$), a second parasitic capacitance 202A from the gate 160A to the source 162A (which may be referred to as $C_{gs}$), and third parasitic capacitance 204A from the drain 164A to the source 162A (which may be referred to as $C_{ds}$), and a resistance 206A. Similarly, the second neutralization transistor 158B may exhibit and be represented by three parasitic capacitances, a first parasitic capacitance 200B from the gate 160B of the second neutralization transistor 158B to the drain 164B (which may be referred to as $C_{gd}$), a second parasitic capacitance 202B from the gate 160B to the source 162B (which may be referred to as $C_{gs}$), and third parasitic capacitance 204B from the drain 164B to the source 162B (which may be referred to as $C_{ds}$), and a resistance 206B.

Figure 12:
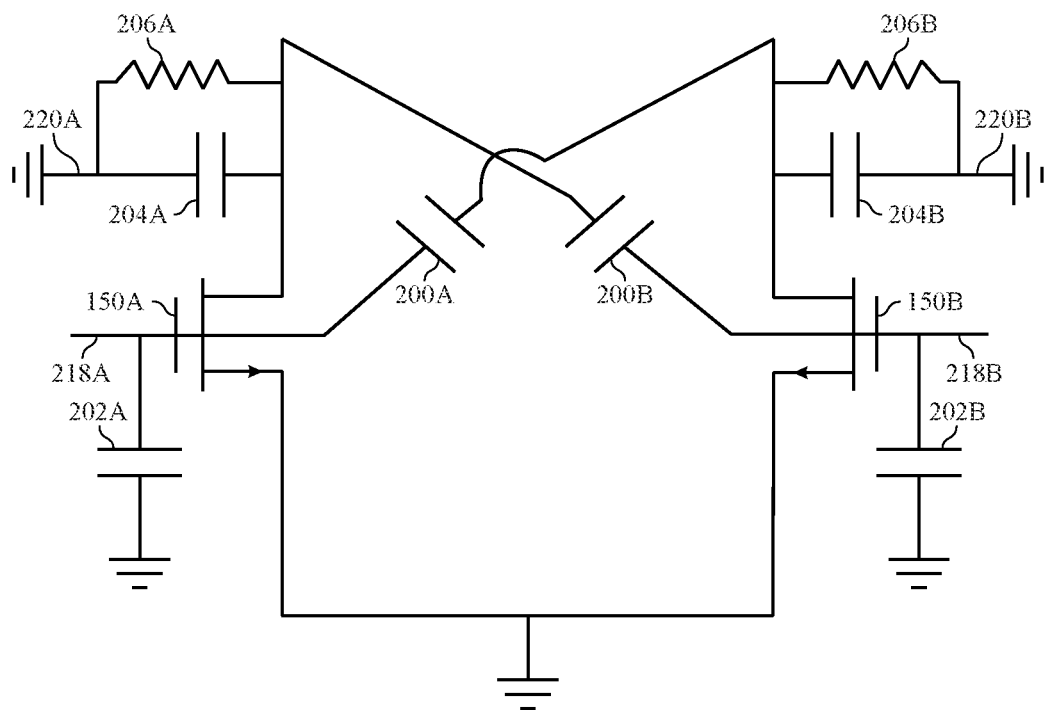
FIG. 12 is a schematic diagram of a representation of the amplification circuitry of FIG. 11 illustrating how certain parasitic capacitances and resistances of the neutralization transistors 158 are absorbed or ignored when operating in differential mode, according to embodiments of the present disclosure.

FIG. 12 is a schematic diagram of a representation of the amplification circuitry 138 of FIG. 11 illustrating how certain parasitic capacitances and resistances of the neutralization transistors 158 are absorbed or ignored when operating in differential mode, according to embodiments of the present disclosure. As mentioned above with respect to the amplifier topologies 98, 118 of FIGS. 5 and 6 and the multi-stage amplifier 130 of FIG. 7, each amplifier 100 may be coupled to one or more impedance matching devices, such as the matching networks of FIG. 7. These matching networks may absorb certain parasitic capacitances of the neutralization transistors 158 when matching impedances of the neutralization transistors 158 (e.g., with the drains of the neutralization transistors 158).

In particular, the parasitic capacitances 202A, 202B (collectively 202) from the gates 160 to the sources 162 ($C_{gs}$) of the neutralization transistors 158 may be absorbed by matching networks coupled to inputs 218A, 218B (collectively 218) of the amplification circuitry 138. Similarly, the parasitic capacitances 204A, 204B (collectively 204) from the drains 164 to the sources 162 ($C_{ds}$) of the neutralization transistors 158 may be absorbed by matching networks coupled to outputs 220A, 220B (collectively 220) of the amplification circuitry 138. Furthermore, resistances at the outputs 220 of the amplification circuitry 138 (e.g., outputs of the amplification transistors 150 and/or of the neutralization transistors 158) may be much smaller than the resistances 206 of the neutralization transistors 158 when the amplification circuitry 138 operates in differential mode. As such, the resistances 206 of the neutralization transistors 158 may be ignored. As illustrated, because the parasitic capacitances 202A, 202B, 204A, 204B may be absorbed, and the resistances 206 may be ignored, only the parasitic capacitances 200A, 200B (collectively 220030) exhibited by the neutralization transistors 158 are from the gates 160 to the drains 164 ($C_{gd}$) of the neutralization transistors 158 may remain.

Figure 13:
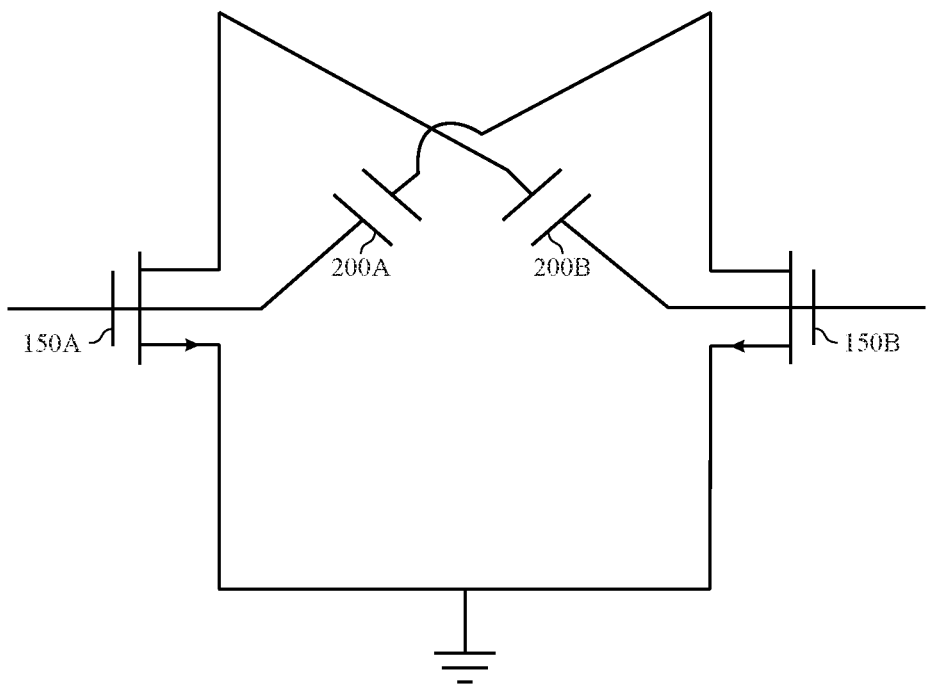
FIG. 13 is a schematic diagram of a representation of the amplification circuitry of FIG. 12 illustrating remaining capacitances after the certain parasitic capacitances and resistances of the neutralization transistors are absorbed or ignored when operating in differential mode, according to embodiments of the present disclosure.

FIG. 13 is a schematic diagram of a representation of the amplification circuitry 138 of FIG. 11 illustrating remaining capacitances after the certain parasitic capacitances and resistances of the neutralization transistors 158 are absorbed or ignored when operating in differential mode, according to embodiments of the present disclosure. With the parasitic capacitances 202 from the gates 160 to the sources 162 ($C_{gs}$) of the neutralization transistors 158 being absorbed by matching networks coupled to the inputs 218 of the amplification circuitry 138, the parasitic capacitances 204 from the drains 164 to the sources 162 ($C_{ds}$) of the neutralization transistors 158 being absorbed by matching networks coupled to the outputs 220 of the amplification circuitry 138, and the resistances 206 of the neutralization transistors 158 being ignored due to being much larger (e.g., effectively acting as open circuits) than outputs 220 of the amplification circuitry 138, the remaining parasitic capacitances 200A, 200B (collectively 200) exhibited by the neutralization transistors 158 are from the gates 160 to the drains 164 ($C_{gd}$) of the neutralization transistors 158.

These parasitic capacitances 200 may be used to accurately match and neutralize the parasitic capacitances 182 of the amplification circuitry 138, as shown in FIG. 9. In particular, the parasitic capacitance 200A ($C_{gd}$) of the first neutralization transistor 158A may neutralize the parasitic capacitance 182 ($C_{gd}$) of the first amplification transistor 140A, and the parasitic capacitance 200B ($C_{gd}$) of the second neutralization transistor 158B may neutralize the parasitic capacitance 182 ($C_{gd}$) of the second amplification transistor 150B. Advantageously, because the neutralization transistors 158 may be manufactured using the same process (e.g., same methods, same techniques, same silicon, same wafers, same batches, and so on) as the amplification transistors 150, the neutralization transistors 158 may operate in the same manner or "track" the amplification transistors 150. That is, as operating characteristics change (e.g., variations in input signals 180, in ambient or environmental conditions), changes in operation of the amplification transistors 150 may be matched or tracked by the neutralization transistors 158. As such, using the neutralization transistors 158, as disclosed herein, may provide more effective neutralization than, for example, capacitors that may have significantly more process variation, as the capacitors are made using different processes and/or different materials than the amplification transistors 150.

Moreover, when compared to amplifiers having a source of a first neutralization transistor coupled in series with a first resistor, a source of a second neutralization transistor coupled in series with a second resistor, and both resistors being coupled to the node that is coupled to ground, there may be parasitic capacitances associated with these resistors. That is, in addition to the parasitic capacitances from gates to drains ($C_{gd}$) of the neutralization transistors, such neutralization transistors also exhibit these parasitic capacitances associated with the resistors. As such, when attempting to neutralize parasitic capacitances of the amplification transistors, not only is the parasitic capacitances from gates to drains ($C_{gd}$), gates to sources ($C_{gs}$), and drains to sources ($C_{ds}$) of the neutralization transistors applied, but so are these parasitic capacitances associated with the resistors. While the parasitic capacitances from gates to drains ($C_{gd}$) of the neutralization transistors track the operating characteristics of the parasitic capacitances of gates to drains ($C_{gd}$) of the amplification transistors, the parasitic capacitances associated with the resistors do not. As such, the parasitic capacitances associated with the resistors may negatively impact neutralization of the parasitic capacitances of the amplification transistors.

This may be avoided in the disclosed embodiments, as they avoid having the source 162A of the first neutralization transistor 158A coupled in series with a first resistor, the source 162B of the second neutralization transistor 158B coupled in series with a second resistor, and both resistors being coupled to a node that is coupled to ground. Instead, the sources 162 of the neutralization transistor 158 are coupled together (e.g., directly coupled, without any intervening components, such as resistors, between the sources 162A, 162B) at the node 166. The node 166 is coupled to the resistor 168, which is coupled to the node 170. The sources 154A, 154B of the amplification transistors 150A, 150B are also coupled to the node 170, as is a ground 172. Coupling the sources 162 together in this manner (e.g., directly coupling, without any intervening components), and sharing the resistor 168, avoids exhibiting such extraneous parasitic capacitances, and enables direct tracking of the parasitic capacitances of gates to drains ($C_{gd}$) of the amplification transistors with the parasitic capacitances from gates to drains ($C_{gd}$) of the neutralization transistors (e.g., without applying additional parasitic capacitances that may not track the parasitic capacitances of gates to drains ($C_{gd}$) of the amplification transistors).

Moreover, the first resistor coupled in series with the source of the first neutralization and second resistor coupled in series with the source of the second neutralization may be excessively lossy (e.g., cause loss in power gain), which may work directly against the purpose of amplifying power in signals. As shown in FIG. 11, the disclosed amplification circuitry 138 does not include such lossy resistors (e.g., which would be coupled between drains 164 of the neutralization transistors 158 and the ground 172).

Figure 14:
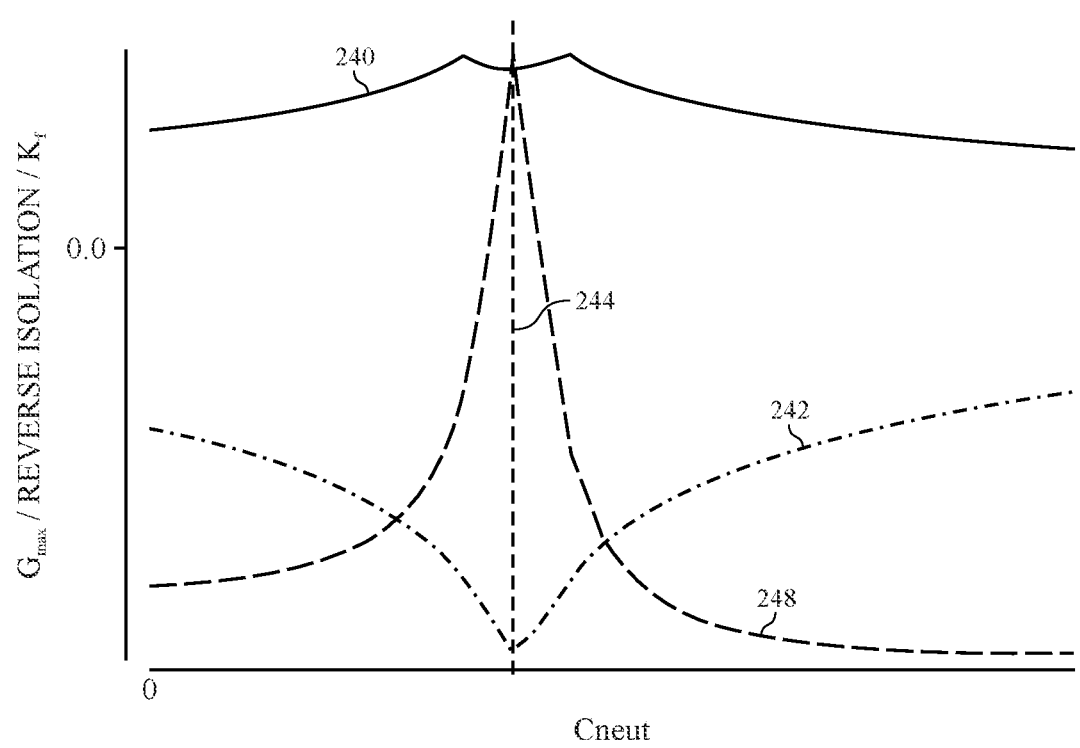
FIG. 14 is a plot illustrating performance of the amplification circuitry of FIG. 8, according to embodiments of the present disclosure.

FIG. 14 is a plot illustrating performance of the amplification circuitry 138, according to embodiments of the present disclosure. In particular, the plot illustrates maximum gain ($G_{max}$) 240 and reverse isolation 242, both of which may be expressed in decibels, provided by the amplification circuitry 138. When neutralization capacitance ($C_{neut}$) (e.g., as provided by the neutralization transistors 158), which may be expressed in farads, is zero, the $G_m$ax 240 provided by the amplification circuitry 138 is low. $C_{neut}$ shown at 244 may be an ideal point of operation. This is because, at the $C_{neut}$ of 244, there is high $G_{max}$ 240, and low reverse isolation 242. As discussed above with respect to FIG. 9, the reverse isolation 242 may be caused by the parasitic capacitances 182 creating feedback paths for the output signals 184 from the amplification transistors 150 to return from the drains 156 to the gates 152, thus making the amplification circuitry 138 unstable and worsening performance of the amplification circuitry 138. The $C_{neut}$ shown at 244 is the point where the $G_{max}$ 240 is very high (e.g., relative to the range of $G_{max}$ 240 over the range of $C_{neut}$), and the reverse isolation 242 is very low (e.g., minimized relative to the range of reverse isolation 242 over the range of $C_{neut}$, such that the parasitic capacitances 182 of the amplification transistors 150 are effectively neutralized).

The plot also illustrates $K_f$ 248, which is a stability factor that quantifies stability of the amplification circuitry 138, and may be unitless. As shown, at the $C_{neut}$ shown at 244, the $K_f$ 248 is very high (e.g., maximized relative to the range of $K_f$ 248 over the range of $C_{neut}$). In particular, the $K_f$ 248 exhibited by the amplification circuitry 138 may be 1 or greater (e.g., 1.2 or greater, 1.4 or greater, 1.6 or greater, 1.8 or greater, and so on, such as 1.9). Moreover, the $G_{max}$ 240 may be on the order of 15 dB or higher, 17 dB or higher, 20 dB or higher, and so on (e.g., 17.6 dB) at mmWave frequencies (e.g., 24.25-300 GHz, 30-100 GHz, 40-60 GHz, such as 43.5 GHz), while providing reverse isolation 242 on the order of −40 dB or less, −50 dB or less, −60 dB or less, and so on (e.g., −50.6 dB).

In particular, when compared to amplifiers having a source of a first neutralization transistor coupled in series with a first resistor, a source of a second neutralization transistor coupled in series with a second resistor, and both resistors being coupled to the node that is coupled to ground, amplifiers having the disclosed amplification circuitry 138 may provide 0.5 dB or greater, 0.75 dB or greater, 1 dB or greater, and so on (e.g., 1.1 dB), greater $G_{max}$ 240. The amplifiers having the disclosed amplification circuitry 138 may also provide better reverse isolation than such amplifiers, on the scale of 5 dB better (e.g. less), 10 dB better, 15 dB better, and so on, such as 12.7 dB better (or less).

Keeping in mind that applications using the amplification circuitry 138, such as the amplifier topologies 98, 118 of FIGS. 5 and 6 and the multi-stage amplifier 130 of FIG. 7, may each have multiple instances of amplifiers 100, which each may have multiple instances of the amplification circuitry 138, any increase in gain and/or reverse isolation, such as an improvement of 1.1 dB in $G_{max}$ 240 and/or an improvement of 12.7 dB in reverse isolation 242, is magnified. Indeed, an electronic device 10 may itself have multiple instances the amplifier topologies 98, 118 of FIGS. 5 and 6 and/or the multi-stage amplifier 130 of FIG. 7, and the improvement in gain and/or reverse isolation for each amplification circuitry 138 may be returned on an exponential scale when viewed at the level of the electronic device 10.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The invention claimed is:

1. An electronic device, comprising:
an antenna; and
a transceiver communicatively coupled to the antenna, the transceiver comprising
an amplifier comprising a plurality of amplification circuits, each amplification circuit of the plurality of amplification circuits comprising
a first transistor,
a second transistor,
a third transistor having a gate coupled to a gate of the first transistor, and a drain coupled to a drain of the second transistor, and
a fourth transistor having a gate coupled to a gate of the second transistor, a drain coupled to a drain the first transistor, and a source coupled to a source of the first transistor, the source of the third transistor and the source of the fourth transistor being coupled to a resistive component, and
an input matching network communicatively coupled to the amplifier.

2. The electronic device of claim 1, wherein the third transistor of a respective amplification circuit is configured to neutralize a first parasitic capacitance of the first transistor of the respective amplification circuit with a second parasitic capacitance of the third transistor when the first transistor exhibits the first parasitic capacitance.

3. The electronic device of claim 1, wherein the fourth transistor of a respective amplification circuit is configured to neutralize a first parasitic capacitance of the second transistor of the respective amplification circuit with a second parasitic capacitance of the fourth transistor when the second transistor exhibits the first parasitic capacitance.

4. The electronic device of claim 1, wherein the resistive component is coupled to ground.

5. The electronic device of claim 4, wherein the resistive component is configured to block current flow from the source of the third transistor and the source of the fourth transistor to the ground.

6. The electronic device of claim 1, wherein the resistive component is coupled to the source of the first transistor and a source of the second transistor.

7. The electronic device of claim 1, wherein the resistive component, the source of the first transistor, and a source of the second transistor are coupled to a switch, wherein the switch is configured to enable a respective amplifier having the switch to amplify an input signal.

8. A transceiver, comprising:
an amplifier comprising a plurality of amplification stages, each amplification stage of the plurality of amplification stages comprising
a first amplifying transistor,
a second amplifying transistor,
a first neutralizing transistor having a gate coupled to a gate of the first amplifying transistor, and a drain coupled to a drain of the second amplifying transistor, and
a second neutralizing transistor having a gate coupled to a gate of the second amplifying transistor, a drain coupled to a drain the first amplifying transistor, and a source coupled to a source of the first neutralizing transistor, the source of the first neutralizing transistor and the source of the second neutralizing transistor being coupled to a resistor, and an input matching network communicatively coupled to the amplifier.

9. The transceiver of claim 8, wherein, in operation, the first neutralizing transistor exhibits a first parasitic capacitance between the gate of the first neutralizing transistor and the drain of the first neutralizing transistor, a second parasitic capacitance between the gate of the first neutralizing transistor and the source of the first neutralizing transistor, and a third parasitic capacitance between the drain of the first neutralizing transistor and the source of the first neutralizing transistor.

10. The transceiver of claim 9, wherein the input matching network communicatively coupled to the amplifier f is configured to absorb the second parasitic capacitance, and a second input matching network eh communicatively coupled to the amplifier is configured to absorb the third parasitic capacitance.

11. The transceiver of claim 10, wherein the amplifier is configured to neutralize a parasitic capacitance of the first amplifying transistor with the first parasitic capacitance.

12. The transceiver of claim 8, wherein the resistor comprises a variable resistor.

13. A device comprising:
    an amplifier comprising a plurality of amplification circuits, each amplification circuit of the plurality of amplification circuits comprising
    a first transistor,
    a second transistor,
    a third transistor having a gate coupled to a gate of the first transistor, and a drain coupled to a drain of the second transistor, and
    a fourth transistor having a gate coupled to a gate of the second transistor, a drain coupled to a drain the first transistor, and a source coupled to a source of the third transistor, the source of the third transistor and the source of the fourth transistor being coupled to a resistor; and input matching circuitry coupled to the amplifier.

14. The device of claim 13, wherein an amplification circuit of the plurality of amplification circuits is configured to cancel a voltage swing received at the source of the first transistor or the third transistor with a voltage swing received at the source of the second transistor or the fourth transistor.

15. The device of claim 13, wherein an amplification circuit of the plurality of amplification circuits is configured to neutralize a parasitic capacitance of the first transistor with a parasitic capacitance of the third transistor.

16. The device of claim 15, wherein the parasitic capacitance of the first transistor is exhibited between the gate of the first transistor and the drain of the first transistor, and the parasitic capacitance of the third transistor is exhibited between the gate of the third transistor and the drain of the third transistor.

17. The device of claim 13, wherein an amplification circuit of the plurality of amplification circuits is configured to neutralize a parasitic capacitance of the second transistor with a parasitic capacitance of the fourth transistor.

18. The device of claim 17, wherein the parasitic capacitance of the second transistor is exhibited between the gate of the second transistor and the drain of the second transistor, and the parasitic capacitance of the third transistor is exhibited between the gate of the third transistor and the drain of the third transistor.

19. The device of claim 13, wherein an amplification circuit of the plurality of amplification circuits is configured to amplify a signal having a frequency of 24 gigahertz or greater.

20. The device of claim 19, wherein a gain of the signal amplified by the amplification circuit is 17 decibels or greater.

* * * * *

UNITED STATES PATENT AND TRADEMARK OFFICE
CERTIFICATE OF CORRECTION

| | | |
|---|---|---|
| PATENT NO. | : 12,362,779 B2 | Page 1 of 1 |
| APPLICATION NO. | : 17/683607 | |
| DATED | : July 15, 2025 | |
| INVENTOR(S) | : Muhammad Adnan and Xiang Guan | |

It is certified that error appears in the above-identified patent and that said Letters Patent is hereby corrected as shown below:

In the Claims

Column 19, Claim 10, Line 16, please delete "f" after the word "amplifier".

Column 19, Claim 10, Line 18, please delete "eh" after the word "network".

Signed and Sealed this
Twenty-eighth Day of October, 2025

John A. Squires
*Director of the United States Patent and Trademark Office*